(12) United States Patent
Arakawa

(10) Patent No.: US 10,497,448 B2
(45) Date of Patent: Dec. 3, 2019

(54) SEMICONDUCTOR MEMORY DEVICE

(71) Applicant: Winbond Electronics Corp., Taichung (TW)

(72) Inventor: Kenichi Arakawa, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/111,157

(22) Filed: Aug. 23, 2018

(65) Prior Publication Data

US 2019/0115084 A1    Apr. 18, 2019

(30) Foreign Application Priority Data

Oct. 12, 2017    (JP) .................................. 2017-198197

(51) Int. Cl.
| | | |
|---|---|---|
| *G11C 14/00* | (2006.01) | |
| *G11C 16/26* | (2006.01) | |
| *G11C 16/04* | (2006.01) | |
| *H01L 23/528* | (2006.01) | |
| *H01L 27/115* | (2017.01) | |

(52) U.S. Cl.
CPC .......... *G11C 16/26* (2013.01); *G11C 16/0483* (2013.01); *H01L 23/528* (2013.01); *H01L 27/115* (2013.01)

(58) Field of Classification Search
CPC ....... G11C 16/26; G11C 7/1057; G11C 7/106; G11C 7/1087; G11C 16/08; G11C 16/24
USPC .................................................... 365/185.12
See application file for complete search history.

(56) References Cited

U.S. PATENT DOCUMENTS

| | | | | |
|---|---|---|---|---|
| 8,498,139 | B2* | 7/2013 | Suzuki | G11C 7/062 365/185.21 |
| 9,218,888 | B2* | 12/2015 | Yamauchi | G11C 16/0483 |
| 9,613,703 | B2 | 4/2017 | Senoo | |
| 2008/0074923 | A1 | 3/2008 | Park et al. | |
| 2009/0201735 | A1 | 8/2009 | Park | |
| 2012/0069656 | A1* | 3/2012 | Suzuki | G11C 7/062 365/185.08 |
| 2014/0104947 | A1* | 4/2014 | Yamauchi | G11C 16/0483 365/185.09 |
| 2014/0185353 | A1 | 7/2014 | Oh et al. | |

FOREIGN PATENT DOCUMENTS

| | | |
|---|---|---|
| CN | 101740125 | 6/2010 |
| JP | H11176177 | 7/1999 |
| TW | I592940 | 7/2017 |

* cited by examiner

*Primary Examiner* — Xiaochun L Chen
(74) *Attorney, Agent, or Firm* — JCIPRNET

(57) ABSTRACT

A semiconductor memory device facilitating an area efficiency of a page buffer/sense circuit and suppressing erroneous operation due to capacitive coupling between wires is provided. The flash memory 100 of the disclosure includes a memory cell array 110 and a page buffer/sense circuit 170. The memory cell array 110 includes a plurality of memory cells. The page buffer/sense circuit 170 holds data read from a page selected by the memory cell array 110 or holds data to be programmed to a page selected by the memory cell array 110. The page buffer/sense circuit 170 is arranged in n columns×m segments within one pitch in a row direction defined by p number of bit lines extending from the memory cell array 110. n is an integer of 2 or more then 2, and m is an integer of 2 or more then 2.

11 Claims, 9 Drawing Sheets

SEMICONDUCTOR MEMORY DEVICE

CROSS-REFERENCE TO RELATED APPLICATION

This application claims the priority benefit of Japan application serial no. 2017-198197, filed on Oct. 12, 2017. The entirety of the above-mentioned patent application is hereby incorporated by reference herein and made a part of this specification.

BACKGROUND OF THE INVENTION

1. Field of the Invention

The invention relates to a semiconductor storage device, and particularly relates to an arrangement and a layout of wires of page buffers/sense circuits of a flash memory.

2. Description of Related Art

FIG. 1 is a view illustrating an overall configuration of a known flash memory. In a memory cell array 10, a plurality of NAND strings NU are formed. A bit line end of each of the NAND strings NU is connected to a bit line selection circuit 20 through an even bit line GBL_e or an odd bit line GBL_o. In addition, a source line end of each of the NAND strings NU is connected to a common source line SL. The bit line selection circuit 20 includes an even selection transistor SEL_e connected to the even bit line GBL_e, an odd selection transistor SEL_o connected to the odd bit line GBL_o, an even bias voltage selection transistor YSEL_e connected between the even bit line GBL_e and a virtual potential VIR, an odd bias voltage selection transistor YSEL_o connected between the odd bit line GBL_o and the virtual potential VIR, and a bit line selection transistor BLS connected to a common node N1 of the even selection transistor SEL_e and the odd selection transistor SEL_o.

A page buffer/sense circuit 30 includes: a pre-charging transistor BLPRE providing a pre-charging potential to a global bit line GBL, a clamp transistor BLCLAMP connected to the global bit line GBL and clamping a voltage of the global bit line GBL during a read operation, a capacitor C connected to a sense node SNS, and a transfer transistor BLCD transferring a charge of the sense node SNS to a latch circuit 40.

The bit line selection circuit 20 may set the odd bit line GBL_o as not selected when the even bit line GBL_e is selected, and set the even bit line GBL_e as not selected when the odd bit line GBL_o is selected. For example, during a read operation, the even bit line GBL_e is selected, the even bias voltage transistor YSEL_e is turned off, the odd bias voltage transistor YSEL_o is turned on, and a potential GND is supplied to the odd bit line GBL_o through the virtual potential VIR. Alternatively, when the odd bit line GBL_o is selected, the even bias voltage transistor YSEL_e is turned on, the odd bias voltage transistor YSEL_o is turned off, and the potential GND is supplied to the even bit line GBL_e through the virtual potential VIR. In reference documents such as Patent Document 1, a bit line shield adapted to reduce noises resulting from capacitance coupling between the adjacent bit lines is disclosed.

DOCUMENTS OF KNOWN ART

Patent Documents

[Patent Document 1] Japanese Patent Publication No. H11-176177

As shown in FIG. 2, the page buffer/sense circuit 30 includes a latch circuit 40 formed by cross-coupling two inverters, and binary data in a complementary relation are stored in a node SLR and a node SLS. The latch circuit 40 receives an analogical potential of the sense node SNS through the transfer transistor BLCD by using the node SLR, and holds data binarized based on the potential of the node SLR. For example, in a read operation, if a selected bit line is pre-charged and a selected memory cell is in a programming state, the selected memory cell is turned off, and a pre-charging potential of the sense node SNS remains unchanged. Nevertheless, if the selected memory cell is in an erasing state, the selected memory cell is turned on, the pre-charging potential of the sense node SNS is discharged to the source line, and the sense node SNS comes to the potential GND. Then, the transfer transistor BLCD is turned on, the charge of the sense node SNS is transferred to the node SLR, and the latch circuit 40 holds binary data corresponding to whether the selected memory cell is in the programming state or the erasing state.

FIG. 3 is a circuit diagram illustrating an inverter forming the latch circuit 40. An inverter includes four transistors connected in series, i.e., a P-type transistor PT1, a P-type transistor PT2, an N-type transistor NT1, and an N-type transistor NT2. An enable signal ENb and an enable signal EN are respectively input to respective gates of the transistors PT1 and NT2. When the enable signal ENb is at an L potential level, the inverter is operable. When the enable signal ENb is at an H potential level, the transistors PT2 and NT1 come to a floating state leaving from VDD and GND.

FIG. 4 is a view illustrating a layout of the known page buffer/sense circuit 30. The page buffer/sense circuit 30 includes sense circuits and latch circuits corresponding to the number of pages of blocks of the memory cell array 10. As shown in FIG. 4, the page buffer/sense circuits 30 within one pitch in a row direction are arranged into 1 column×8 segments, i.e., eight segments of the page buffers/sense circuits 30 are arranged in one row. The respective sense nodes SNS of the eight segments of the page buffers/sense circuits 30 are respectively connected to eight global bit lines GBL. The eight global bit lines are classified into even bit lines and odd bit lines by the bit line selection circuit 20. Here, the one pitch in the row direction is defined based on the designed number or the pitch of wires of the even bit lines and odd bit lines arranged on the memory cell array 10. In the example, one pitch is a width or pitch of the wires of 16 even bit lines and odd bit lines.

FIG. 5 is a view illustrating a layout of metal wires of the latch circuit 40 included in the page buffer/sense circuit 30. Within one pitch in the row direction, seven metal wires are arranged in a direction orthogonal to the pitch. In other words, the layout includes seven metal wires, i.e., a metal wire PWR for power supply, a metal wire SLR connected to the node SLR, a metal wire SLS connected to the node SLS, a metal wire GND connected to the potential GND, and a metal wire SNS connected between the global bit line and the sense node SNS. The metal wires GND are arranged at two sides of the metal wire SNS. In addition, the metal wire SNS is shielded so as not to be affected by voltage variations of other metal wires.

For example, in a read operation, the node SLR of the latch circuit 40 is on standby at the H potential level, whereas the node SLS is on standby at the L potential level. Then, the charge appearing at the sense node SNS is transferred to the node SLR through the transfer transistor BLCD. The sense node SNS is pre-charged at 1.2V, for example, and supplies the VDD at 1.5V to the latch circuit

40, for example. If the sense node SNS is at 1.2V, the voltage of the node SLR may drop slightly. The node SLR holds data at the H potential level, and the node SLS holds data at the L potential level. When the sense node SNS discharges to GND, the voltage of the node SLR may drop significantly, the node SLR is inverted from H to L, and the node SLS is inverted from L to H.

Due to the refinement of line width, capacitances of metal wires become greater, and a capacitance coupling rate between the metal wires becomes higher. Thus, the influence of voltage variation of the adjacent metal wire is unable to be ignored. For example, when the latch circuits of the page buffers/sense circuits are adjacent, i.e., when the metal wire SLR of a latch circuit is in adjacency with the metal wire SLR of another latch circuit, if data read by the selected memory cells of the respective global bit lines are different, one of the metal wires SLR is at the H potential level, whereas the other of the metal wires SLR is transited to the potential GND. Under the circumstance, the voltage of the one of the metal wires SLR may drop due to capacitance coupling. Alternatively, when a metal wire SLR is in adjacency with another metal wire SLR, if data read by the selected memory cells of the respective global bit lines are both [0] (i.e., programmed state), the metal wire SLR is at the H potential level, while the other metal wire SLR is transited to the GND potential level. Under such circumstance, the voltage of the metal wire SLR drops due to capacitance coupling. If the voltage of the node SLR drops to lower than a threshold of the inverter, an erroneous operation of the latch circuit 40 may occur, and an error in data reading or data validating may occur.

As shown in FIG. 4, the known page buffer/sense circuit 30 is in a layout of 1 column×8 segments. Since the latch circuits are not adjacent, there is no capacitance coupling of the metal wire SLR with the metal wires SLR or SLS of other latch circuits. Therefore, the metal wire SLR is not affected by voltage variations of the metal wires. Nevertheless, given the layout of the 1 column×8 segments, the number of stacked segments of the page buffers/sense circuits becomes greater, and the area efficiency of the page buffers/sense circuits 30 is not desirable. As the degree of integration of circuit components becomes higher and the number of pages becomes greater, the number of page buffers/sense circuits is also increased. Hence, facilitating the area efficiency of the page buffers/sense circuits is key to the miniaturization of chip size.

SUMMARY OF THE INVENTION

A semiconductor storage device according to an embodiment of the invention includes: a memory cell array including a plurality of memory cells; and a page buffer/sense circuit holding data read from a page selected by the memory cell array or holding data to be programmed to a page selected by the memory cell array. Within one pitch in a row direction defined by p bit lines extending from the memory cell array, the page buffer/sense circuit is arranged into n columns×m segments, wherein n is an integer equal to or greater than 2, and m is an integer equal to or greater than 2.

According to an embodiment of the invention, the page buffer/sense circuit includes a latch circuit, and a plurality of wires for n sets of latch circuits are formed within the one pitch. According to an embodiment of the invention, a first wire in which a first latch circuit is connected to a first node for holding data is arranged to be distant from a second wire in which a second latch circuit is connected to a second node for holding data. According to an embodiment of the invention, a third wire connected to a first sense node of a first page buffer/sense circuit and a fourth wire connected to a second sense node of a second page buffer/sense circuit are formed between the first wire and the second wire. According to an embodiment of the invention, a fifth wire connected to GND is formed between the third wire and the fourth wire. According to an embodiment of the invention, the first wire and the second wire are arranged to be linearly symmetrical with respect to the fifth wire. According to an embodiment of the invention, the first node receives a charge from the first sense node through a first transfer transistor, and the second node receives a charge from the second sense node through a second transfer transistor. According to an embodiment of the invention, the n sets of latch circuits are formed in an N-well region and a P-well region defined based on the one pitch. According to an embodiment of the invention, P-channel metal-oxide-semiconductor (PMOS) transistors of the n sets of latch circuits are formed in the N-well region, and N-channel metal-oxide-semiconductor (NMOS) transistors of the n sets of latch circuits are formed in the P-well region. According to an embodiment of the invention, the page buffer/sense circuit is arranged into 2 columns×4 segments in the one pitch. According to an embodiment of the invention, within the one pitch and on inner sides of a pair of wires for power supply, a wire connected to a node of a first latch circuit, a wire connected to another node of the first latch circuit, a wire connected to a first sense node, a wire connected to ground, a wire connected to a node of a second latch circuit, and a wire connected to another node of the second latch circuit are sequentially formed.

According to the embodiments of the invention, the page buffers/sense circuits are arranged into n columns×m segments within one pitch in the row direction defined by p bit lines extending from the memory cell array, wherein n is an integer equal to or greater than 2, and in is an integer equal to or greater than 2. Therefore, the area efficiency of the page buffers/sense circuits may be facilitated, and the chip may be miniaturized. In addition, the wires connected to the nodes of adjacent latch circuits are distant from each other. Therefore, an error operation of the latch circuit resulting from the coupled capacitance between the wires may be avoided.

DESCRIPTION OF THE EMBODIMENTS

Figure 6:
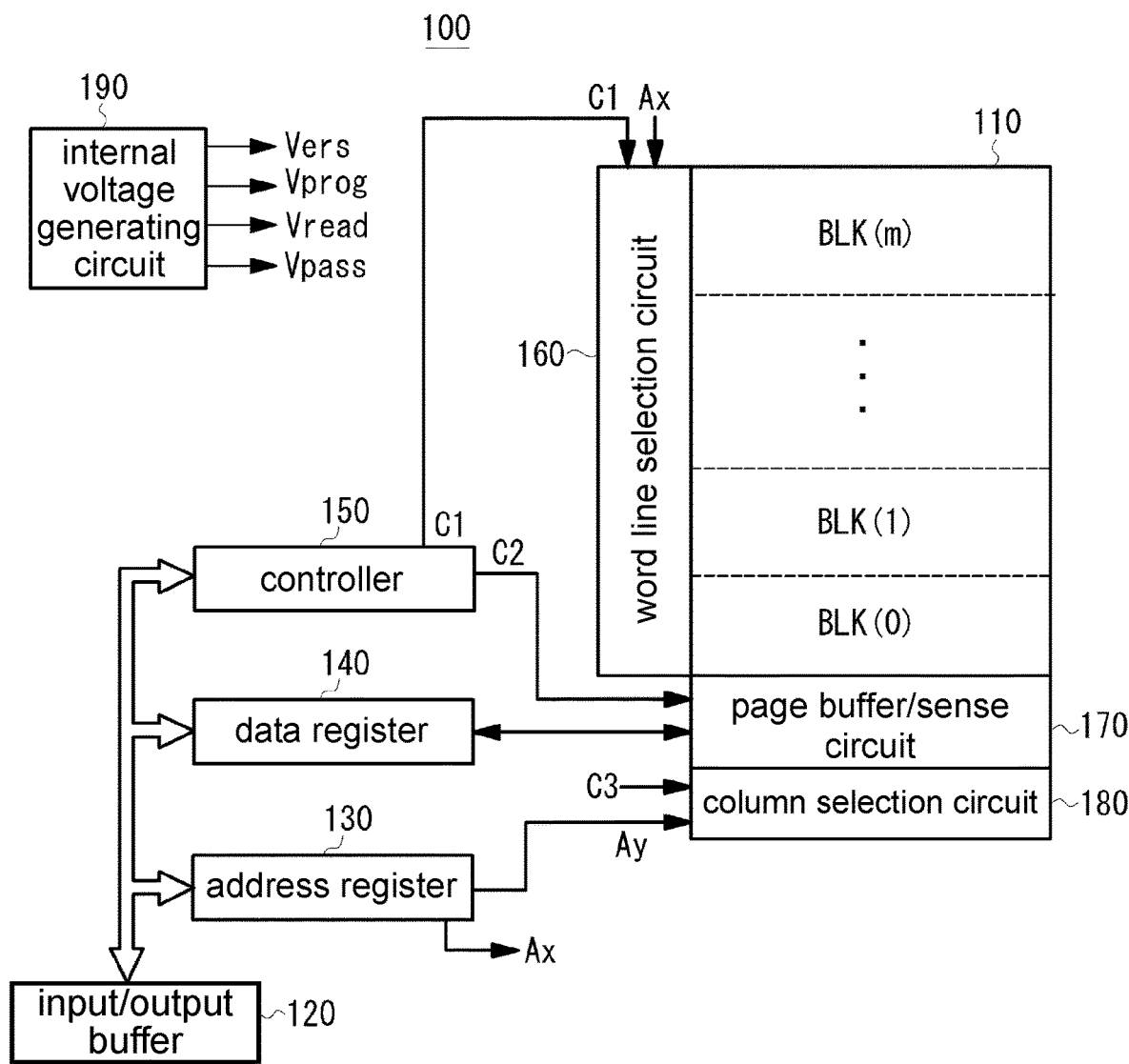
FIG. 6 is a block diagram illustrating an example of a configuration of a flash memory according to an embodiment of the invention.

FIG. 6 is a block diagram illustrating a configuration of a flash memory according to an embodiment of the invention. A flash memory 100 includes the following: a memory cell array including a plurality of memory cells formed into an array; an input/output buffer 120 connected to an external input/output terminal I/O and holding input/output data; an address register 130 receiving address data from the input/output buffer 120 and a data register 140 holding input/output data; a controller 150 providing a control signal C1, a control signal C2, a control signal C3, and/or the like controlling the respective parts based on instruction data from the input/output buffer 120 and an external control signal (e.g., a chip enable signal or an address latch enable signal not shown herein); a word line selection circuit 160 decoding row address information Ax from the address register 130 and choosing a block and choosing a word line based on a decoding result; a page buffer/sense circuit 170 holding data read from a page selected by the word line selection circuit 160 or holding data to be written to a selected page; a column selection circuit 180 decoding column address information Ay from the address register 130 and choosing column data in the page register 170 based on a decoding result; and an internal voltage generating circuit 190 generating voltages required for reading, programming, erasing, and/or the like of data (e.g., a programming voltage Vpgm, a passing voltage Vpass, a read passing voltage Vread, an erasing voltage Vers, and/or the like).

The memory cell array 110 includes a plurality of blocks BLK(0), BLK(1) . . . BLK(m) arranged in a column direction. The page buffer/sense circuit 170 is arranged at an end part of the block. A plurality of NAND strings formed by serially connecting a plurality of memory cells are formed in each block. Each NAND string includes a plurality of memory cells connected in series, a bit line selection transistor connected to drain side of the memory cells, and a source line selection transistor connected to source side of the memory cells.

In a read operation, a positive voltage is applied to the bit line, a voltage (e.g., 0V) is applied to the selected word line, the pass voltage Vpass (e.g., 4.5V) is applied to the non-selected word line, the bit line selection transistor and the source line selection transistor are turned on, and 0V is applied to a common source line. In a programming operation, the programming voltage (e.g., 15V to 20V) is applied to the selected word line, an intermediate voltage (e.g., 10V) is applied to the non-selected word line, the bit line selection transistor is turned on, the source line selection transistor is turned off, and a potential corresponding to data [0] or [1] is applied to the bit line. In an erasing operation, 0V is applied to the selected word line of the selected block, and a high voltage (e.g., 20V) is applied to the P-well. Reading or programming is carried out by using page as a unit, whereas erasing is carried out by using block as a unit.

Figure 1:
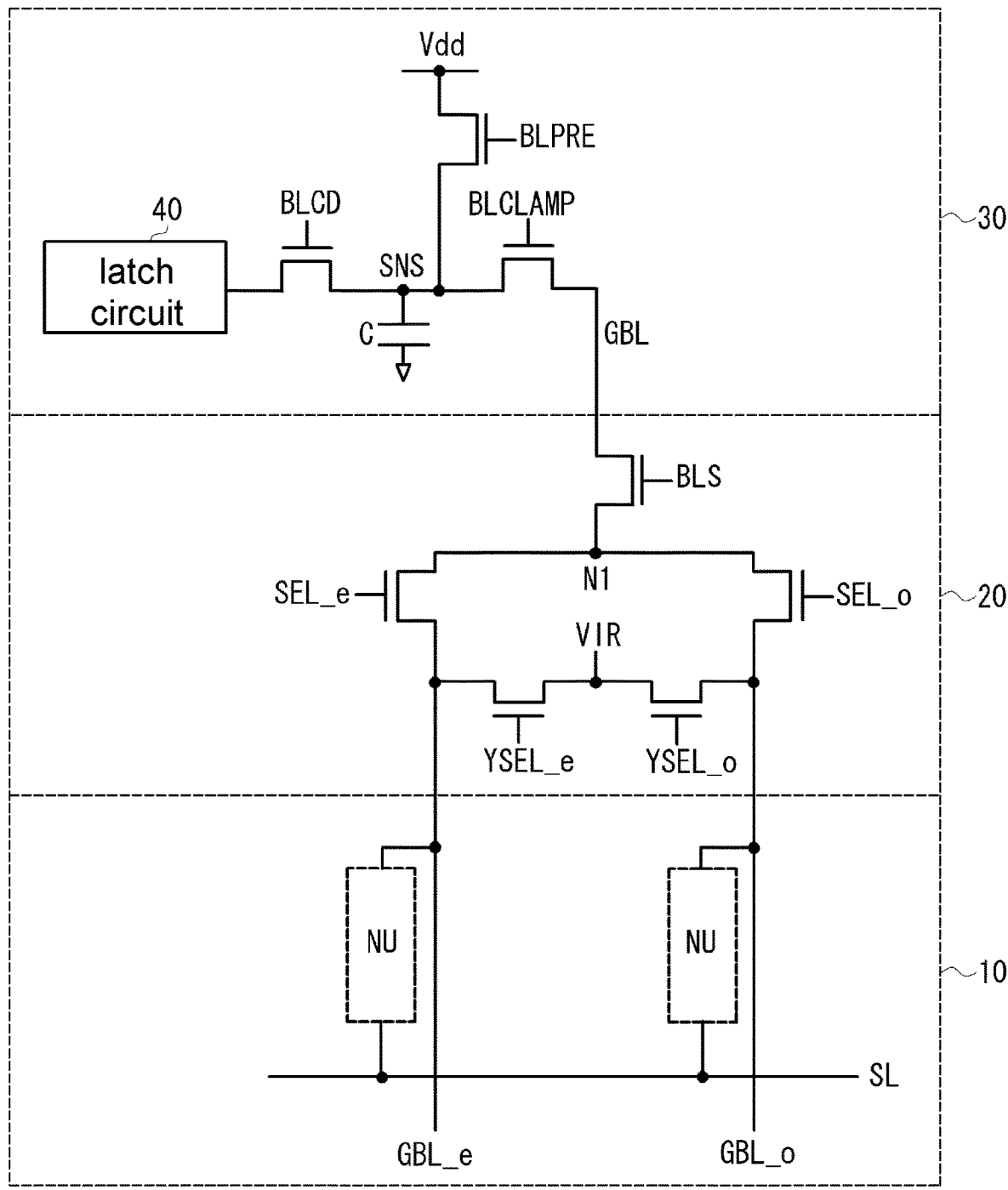
FIG. 1 is a view illustrating an overall configuration of a known flash memory.
Figure 2:
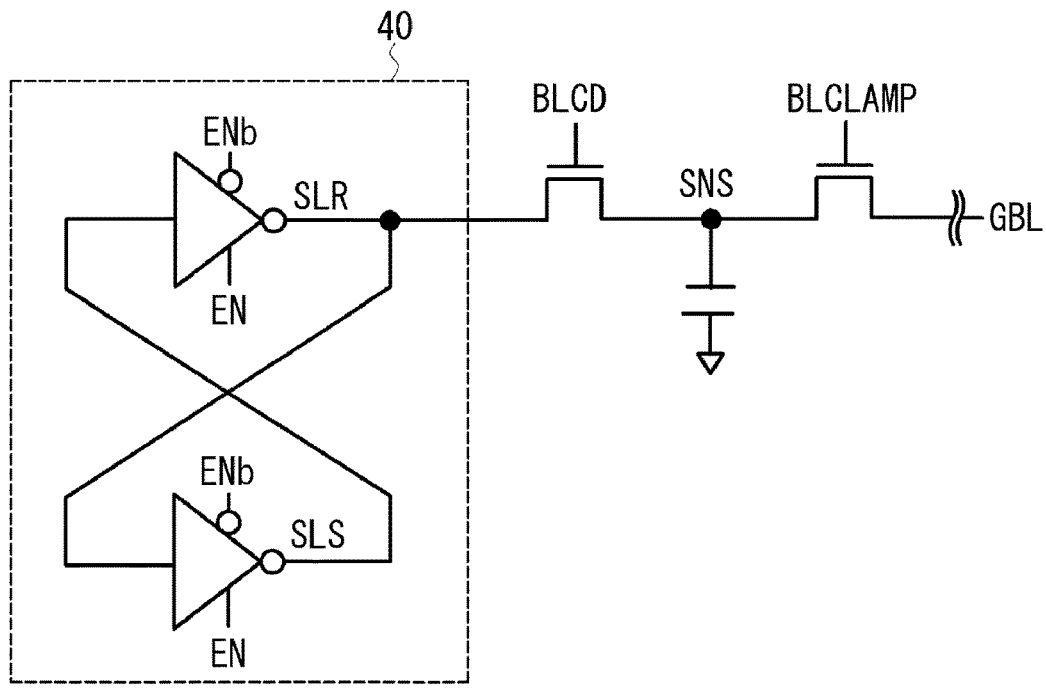
FIG. 2 is a view illustrating a latch circuit included in a page buffer/sense circuit.
Figure 3:
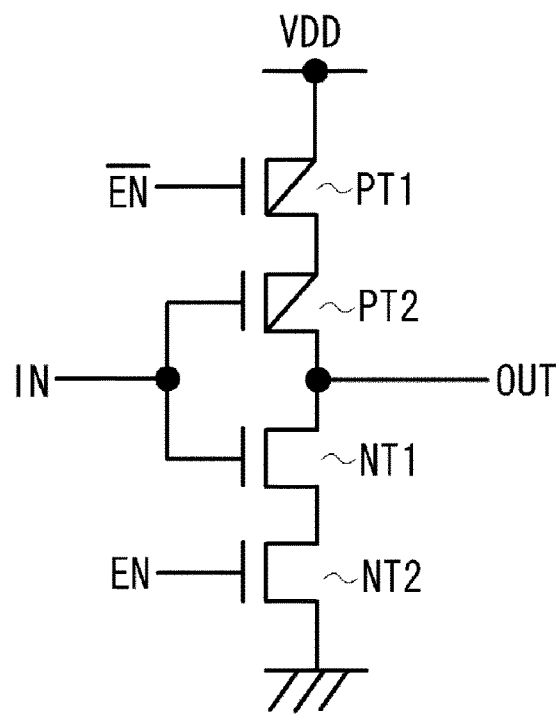
FIG. 3 is a circuit diagram illustrating an inverter forming a latch circuit.
Figure 7:
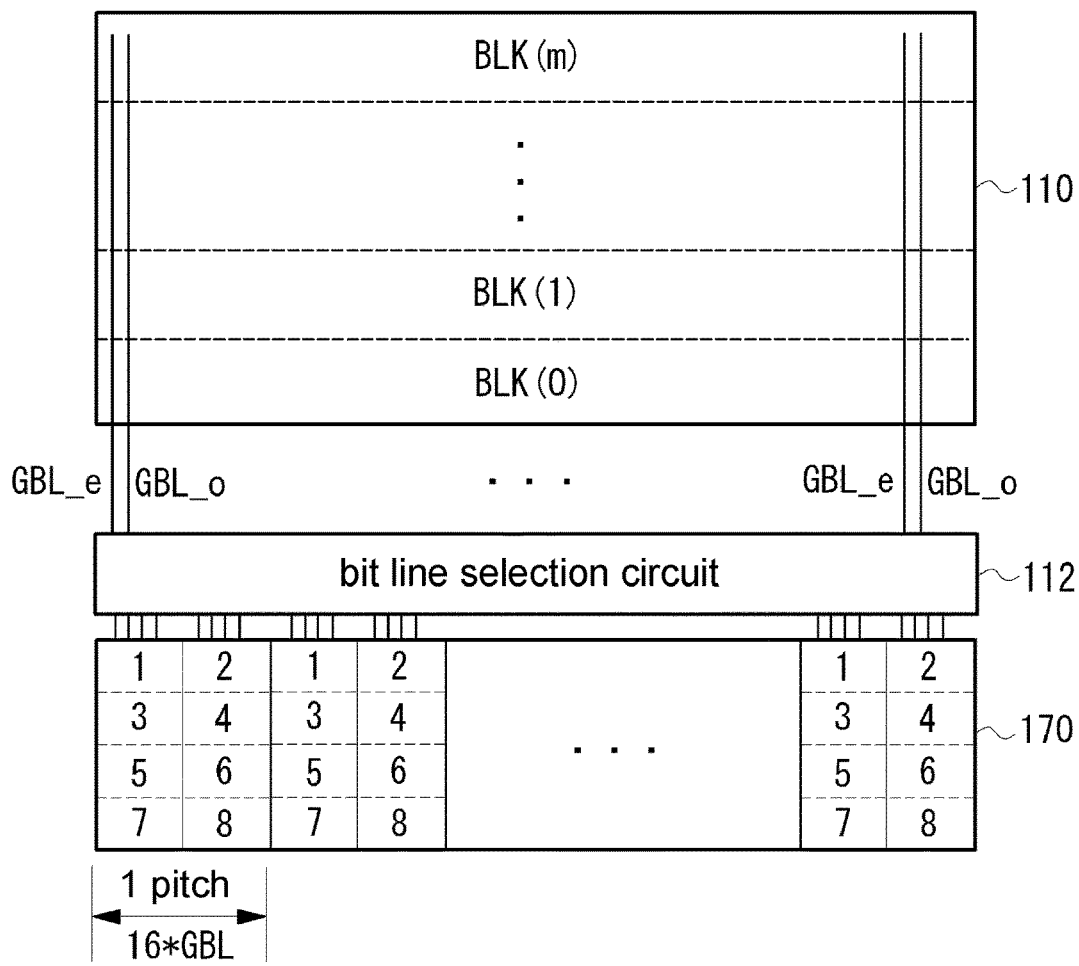
FIG. 7 is a view illustrating a schematic diagram of a page buffer/sense circuit according to an embodiment of the invention.

Then, the page buffer/sense circuit 170 is described in the following. FIG. 7 is a view illustrating a schematic layout of the page buffer/sense circuits 170 according to the embodiment. As shown in FIG. 7, within one pitch in a row direction, the page buffer/sense circuit 170 includes 8 page buffers/sense circuits arranged into 2 columns×4 segments. In other words, the page buffer/sense circuits 170 of one byte are arranged within one pitch in the row direction. As shown in FIG. 1, each page buffer/sense circuit includes one sense circuit (the BLCLAM transistor, the BLCD transistor, the BLPRE transistor, and the sense node SNS) and the latch circuit 40.

One pitch in the row direction is defined based on the number or the pitch of wires of even bit lines GBL_e and odd bit lines GBL_o extending from the memory cell array 110 or based on a design rule. In the embodiment, one pitch in the row direction is defined as the width or pitch of wires when 16 even bit lines GBL_e and odd bit lines GBL_o are arranged along the column direction of the memory cell array 110. A global bit line GBL connected to the sense node SNS of the page buffer/sense circuit 170 is connected to the even bit line GBL_e or the odd bit line GBL_o through a bit line selection circuit 112. Therefore, eight page buffers/sense circuits 170 connected to eight global bit lines GBL are arranged within one pitch in the row direction, and two sets of page buffers/sense circuits 170 are arranged in one row.

Figure 4:
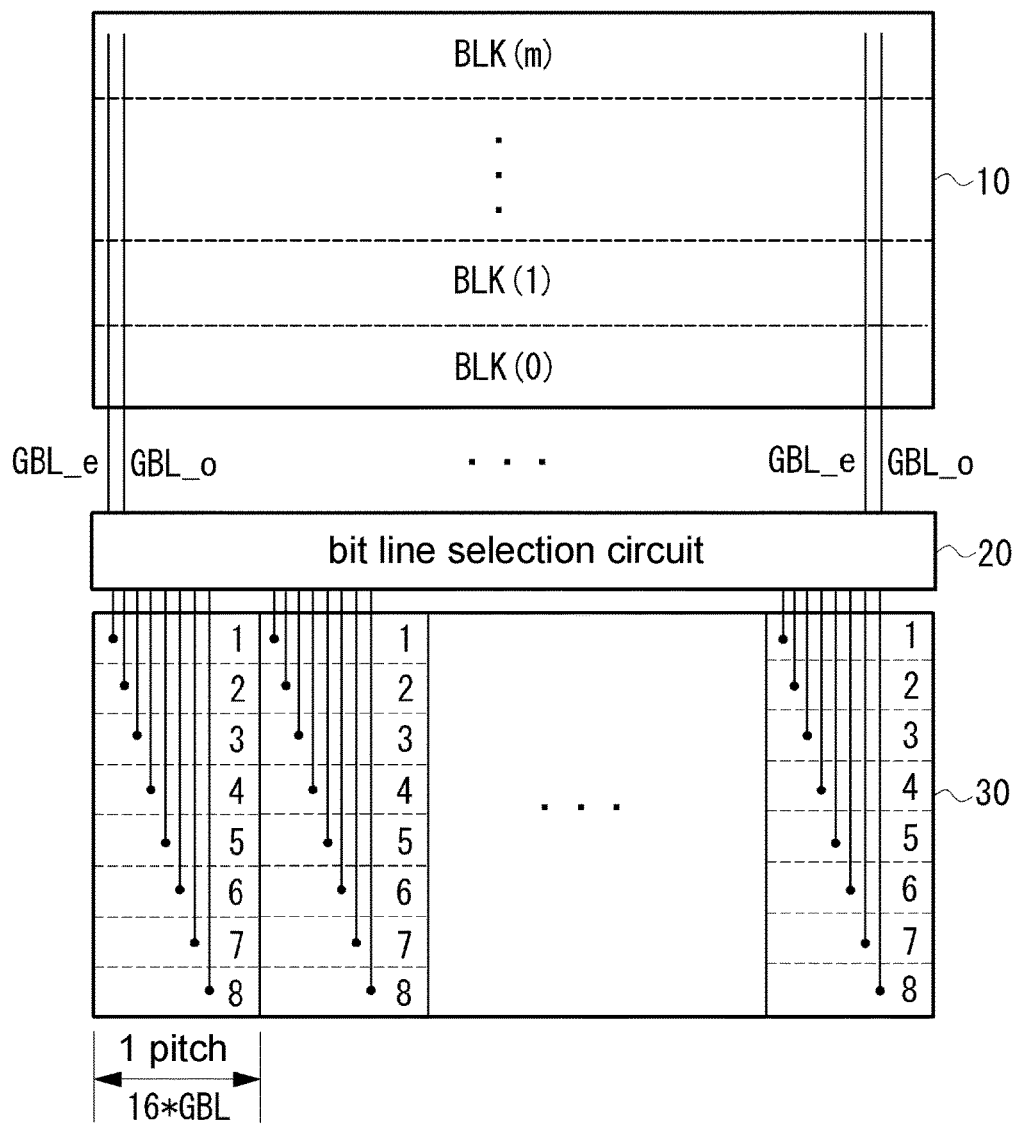
FIG. 4 is a view illustrating an overall layout of a known page buffer/sense circuit.

Compared with the known arrangement where the page buffer/sense circuits are arranged into 1 column×8 segments in one pitch in the row direction (as shown in FIG. 4), the arrangement of the embodiment where the page buffers/sense circuits 170 are arranged into 2 columns×4 segments reduces the number of segments of the page buffers/sense circuits in the column direction and facilitates the area efficiency for arranging the page buffers/sense circuits 170.

Figure 8:
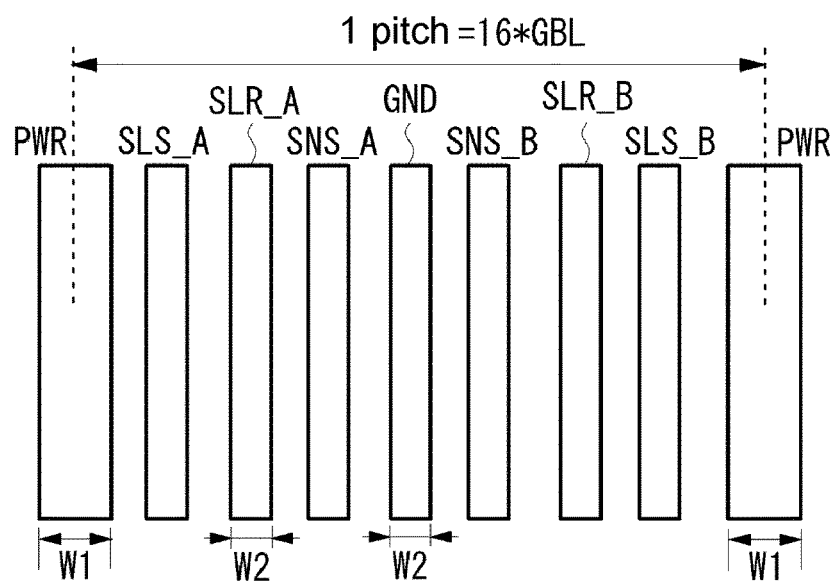
FIG. 8 is a view illustrating a layout of metal wires of a latch circuit arranged in one pitch in a row direction according to an embodiment of the invention.

FIG. 8 is a view illustrating a layout of metal wires of latch circuits of two sets of page buffers/sense circuits arranged in one pitch. For the ease of distinguishing between the two sets of page buffers/sense circuits, one of the sets is referred to as "unit A", and the other is referred to as "unit B".

As shown in FIG. 8, within one pitch in the row direction, nine metal wires are arranged in a direction orthogonal to the pitch. Specifically, the metal wires include a metal wire PWR for power supply, a metal wire SLS_A connected to a node SLS_A of a latch circuit of the unit A, a metal wire SLR_A connected to a node SLR_A connected to the latch circuit of the unit A, a metal wire SNS_connected to a sense node SNS_A of the unit A, a metal wire GND connected to GND, a metal wire SNS_B connected to a sense node SNS_B of the unit B, a metal wire SLR_B connected to a node SLR_B of a latch circuit of the unit B, a metal wire SLS_B connected to a node SLS_B of the latch circuit of the unit B, and another metal wire PWR for power supply. The metal wire SNS_A and the metal wire SNS_B are respectively connected to corresponding global bit lines.

Figure 5:
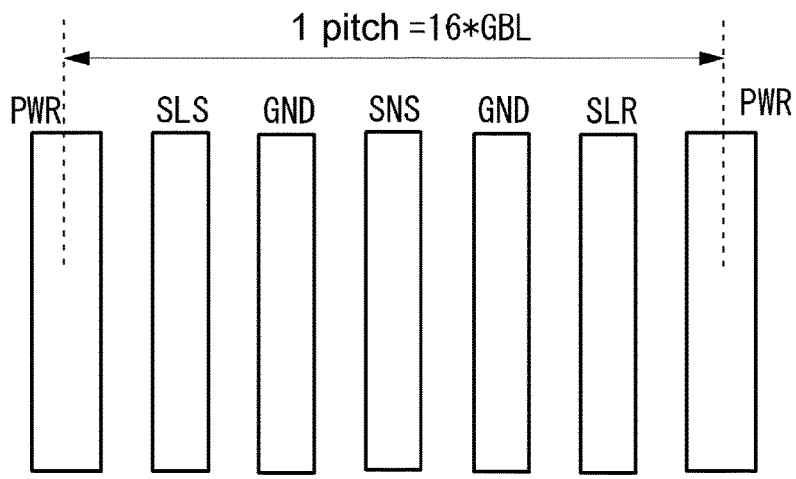
FIG. 5 is a view illustrating a layout of metal wires of a latch circuit within one pitch in a row direction.

In a half of the one pitch on a side, the metal wires for the latch circuit of the unit A are arranged, and in the other half of the pitch, the metal wires for the latch circuit of the unit B are arranged. The metal wires of the unit A and the metal wires of the unit B are arranged to be linearly symmetrical with respect to the metal wire GND at the center. A line width of each of the pair of metal wires PWR is W1, a line width of each of the seven metal wires on the inner side is W2, and W2<W1. Compared with the number of metal wires arranged within one pitch in the known arrangement (as shown in FIG. 5), the line width W2 and a wiring pitch of the seven metal wires of the embodiment are arranged to be narrower than those of the metal wires shown in FIG. 5, so as to increase the number of metal wires arranged.

The metal wire GND is arranged in adjacency to a side of the metal wire SNS_A to reduce a voltage drop resulting from capacitance coupling. The metal wire SLR_A is arranged in adjacency to the other side of the metal wire SNS_A. In the read operation, the node SLR_A is connected to the sense node SNS_A. In other words, the node SLR_A and the sense node SNS_A are at the same potential. Therefore, even if the metal wire SLR_A is arranged in adjacency to the metal wire SNS_A, the effect of capacitance coupling does not occur. The same principle applies to the metal wire SNS_B of the unit B. Thus, the metal wire SLR_A of the unit A is arranged to be distant from the metal wire SLS_B of the unit B, and the metal wire SLR_B of the unit B is arranged to be distant from the metal wire SLS_A of the unit A. Therefore, the influence of the capacitance coupling when the node SLS_B and the node SLS_A are inverted on the node SLR_A and the node SLR_B may be suppressed.

According to the embodiment, the eight page buffers/sense circuits in one pitch are arranged into the 2 columns× four segments. Consequently, the area efficiency of the page buffers/sense circuits is facilitated and the chip area is miniaturized. Besides, even if two sets of page buffers/sense circuits are arranged within one pitch in the row direction, the influence of the capacitance coupling between the metal wires of the latch circuits are not excessively induced. Therefore, it is ensured that the sense circuits are operated normally.

Figure 9:
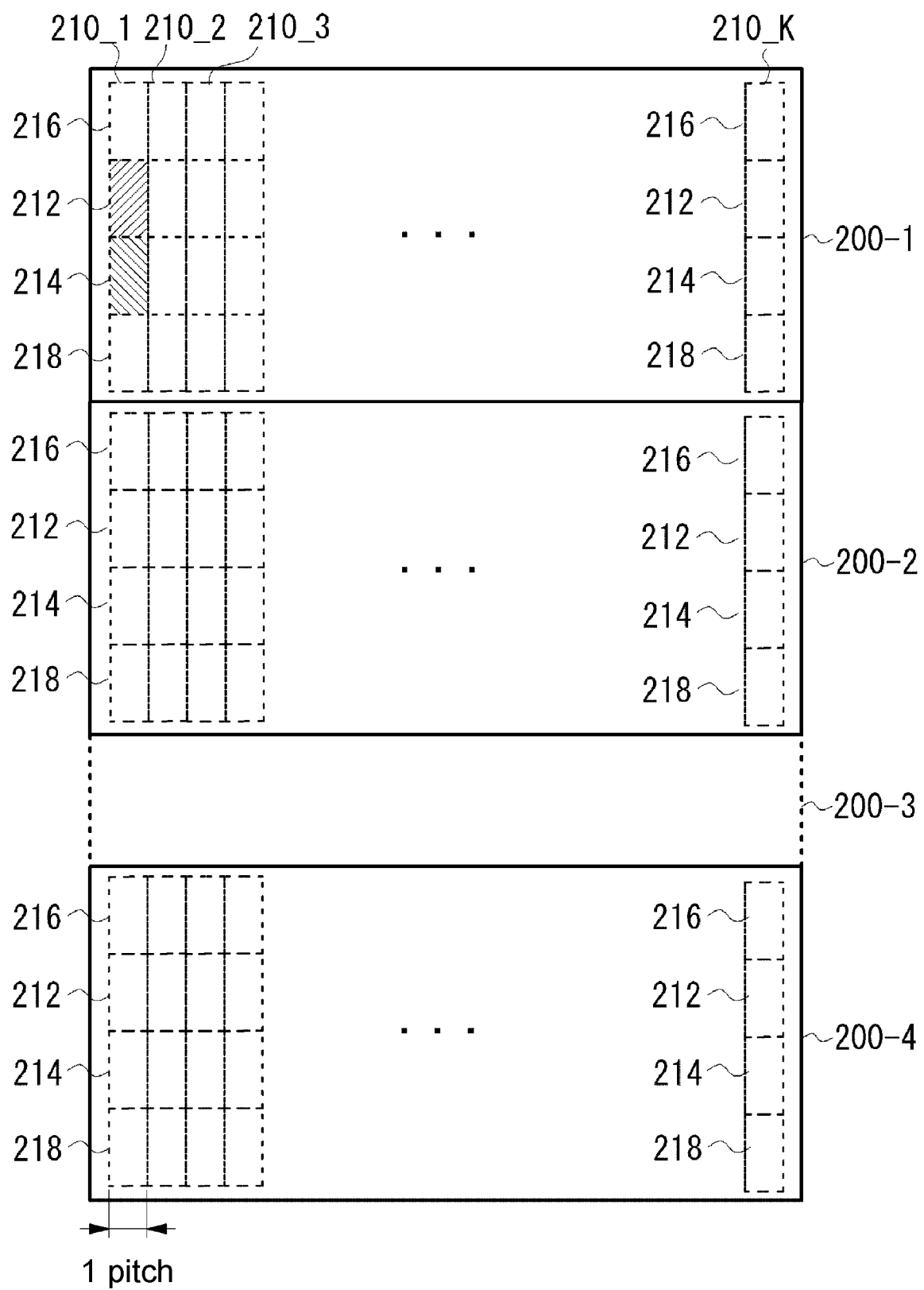
FIG. 9 is a view illustrating a detailed layout of a page buffer/sense circuit according to an embodiment of the invention.

FIG. 9 is a view illustrating a detailed layout of the page buffers/sense circuits 170. The page buffer/sense circuits 170 include sense circuits and latch circuits corresponding to the number of pages of the memory cell array 110. In a region where periphery circuits are formed on a chip, four segments of rectangular regions 200-1 to 200-4 are arranged in the column direction. The page buffers/sense circuits 170 are formed in the rectangular regions (generally referred to as the rectangular region 200).

Each of the rectangular regions 200 further includes a plurality of elongated rectangular regions 210 in the row direction. If the number of pages is 2 Kbytes, the number of the elongated rectangular regions 210 formed in the row direction is also 2K. In a long side direction (column direction) of the elongated rectangular region 210, the elongated rectangular region 210 includes a PMOS region 212 (e.g., an N-well region) for forming PMOS transistors of the latch circuits of the unit A and the unit B, an NMOS region 214 (e.g., a P-well region) for forming NMOS transistors of the latch circuits of the unit A and the unit B, and regions 216 and 218 (e.g., a N-well region or a P-well region) for forming other circuit devices (e.g., the transistors BLCD, BLCLAMP, BLPRE, and/or the like) of the page buffers/sense circuits 170. A length of each elongated rectangular region 210 in the row direction is one pitch, and two sets of page buffers/sense circuits 170 are formed in each elongated region 210 in one segment of the rectangular region 200. Therefore, eight (1 byte) page buffers/sense circuits 170 are formed in four corresponding elongated rectangular regions 210 in the four segments of rectangular region 210-1 to 210-4.

Figure 10:
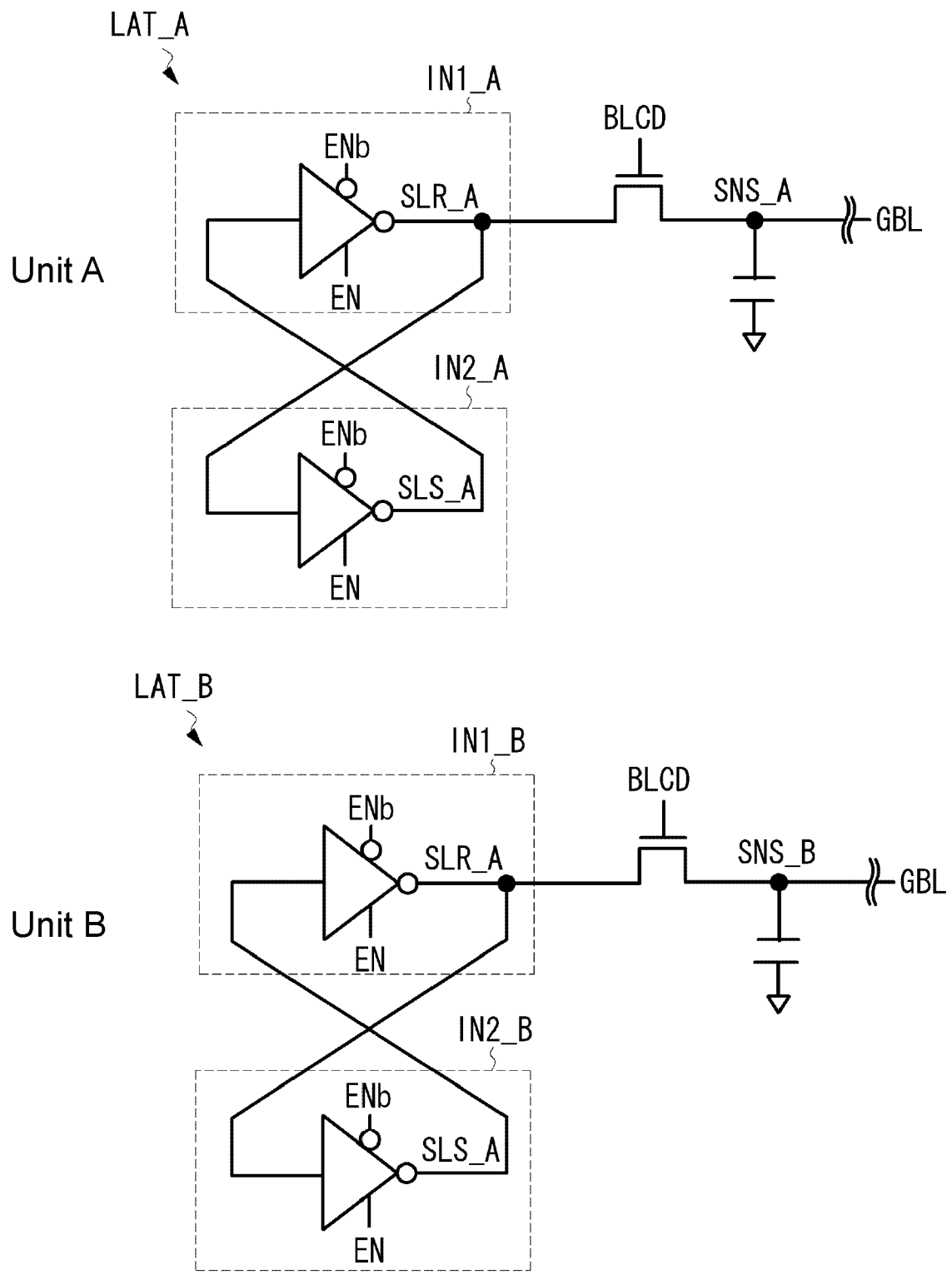
FIG. 10 is a view illustrating a latch circuit with two sets of page buffers/sense circuits according to an embodiment of the invention.
Figure 11:
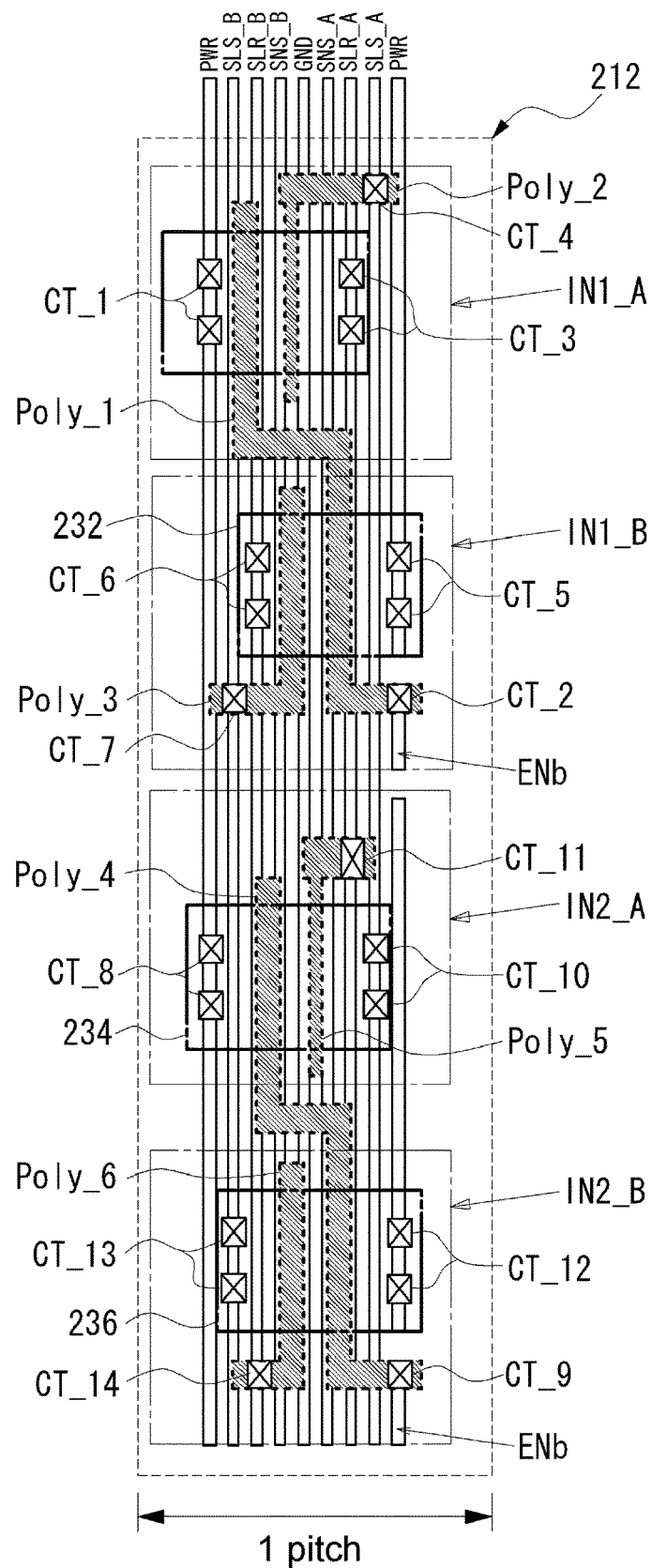
FIG. 11 is a view illustrating a layout of PMOS transistors of two sets of latch circuits according to an embodiment of the invention.

FIG. 10 is a circuit diagram illustrating two sets of page buffers/sense circuits 170, and FIG. 11 is a view illustrating a layout of wires of the PMOS region 212 of the elongated rectangular region 210.

As shown in FIG. 10, the page buffer/sense circuit of the unit A is connected to a latch circuit LAT_A of the sense node SNS through a transfer transistor BLCD. The latch circuit LAT_A includes an inverter IN1_A and an inverter IN2_A. In addition, the inverter IN1_A and the inverter IN2_A are cross-coupled by outputting the node SLR_A on an output side of the inverter IN1_A to the inverter IN2_A, and outputting the node SLS_A on an output side of the inverter IN2_A to the inverter IN1_A.

The inverter IN1_A and the inverter IN2_A are formed by serially connecting a PMOS transistor PT1 and a PMOS transistor PT2 to an NMOS transistor NT1 and an NMOS transistor NT2. In addition, VDD is supplied to a source of the transistor PT1, and GND is connected to a source of the transistor NT2. A common gate of the transistor PT2 and the transistor NT1 is for inputting, and drains of the transistor PT2 and the transistor NT1 are for outputting. The page buffer/sense circuit of the unit B has the same configuration.

In the PMOS region 212, eight PMOS transistors PT1 and PT2 of the inverters IN1_A, IN2_A, IN1_B, and IN2_B of the latch circuits LAT_A and LAT_B of the units A and B are formed. In the NMOS region 214, eight NMOS transistors NT1 and NT2 of the inverters IN1_A, IN2_A, IN1_B, and IN2_B are formed.

As shown in FIG. 11, in the P-well region, the PMOS region 212 includes four N-well regions 230, 232, 234 and 236. In the N-well region 230, the transistor PT1 and the transistor PT2 of the inverter IN1_A are formed. In the N-well region 232, the transistor PT1 and the transistor PT2 of the inverter IN1_B are formed. In the N-well region 234, the transistor PT1 and the transistor PT2 of the inverter IN2_A are formed. In the N-well region 236, the transistor PT1 and the transistor PT2 of the inverter IN2_B are formed. In the four N-well regions 230, 232, 234, and 236, nine metal wires shown in FIG. 8 extend in the column direction, and polysilicon wires forming gates of the transistors are formed at a lower layer of the metal wires. In addition, eight global bit lines not shown herein are formed as metal wires at a layer higher than the nine metal wires.

In the N-well region 230, a polysilicon wire Poly_1 is the gate of the transistor PT1. In addition, a source region of the transistor PT1 is connected to the metal wire PWR via a node CT_1 for supply of VDD. A metal wire ENb is connected to the polysilicon wire Poly_1 via a node CT_2. The metal wire ENb is formed at a portion formed by removing a portion of the metal wire PWR. In addition, a polysilicon wire Poly_2 is the gate of the transistor PT2. In addition, a drain region of the transistor PT2 is connected to the metal wire SLR_A via a node CT_3. The polysilicon wire Poly_2 is connected to the metal wire SLS_A via a node CT_4.

In the N-well region 232, the polysilicon wire Poly_1 is the gate of the transistor PT1. In addition, the source region of the transistor PT1 is connected to the metal wire PWR via a node CT_5 for supply of VDD. In addition, the polysilicon wire Poly_3 is the gate of the transistor PT2. In addition, the drain region of the transistor PT2 is connected to the metal wire SLR_B via a node CT_6. The polysilicon wire Poly_3 is connected to the metal wire SLS_B via a node CT_7.

In the N-well region 234, the transistors PT1 and PT2 of the inverter IN2_A of the unit A are formed. A polysilicon wire Poly_4 is the gate of the transistor PT1. In addition, the source region of the transistor PT1 is connected to the metal wire PWR via a node CT_8 for supply of VDD. The metal wire ENb is connected to the polysilicon wire Poly_4 via a node CT_9. A polysilicon wire Poly_5 is the gate of the transistor PT2. In addition, the drain region of the transistor PT2 is connected to the metal wire SLS_A via a node CT_10. The polysilicon wire Poly_5 is connected to the metal wire SLR_A via a node CT_11.

In the N-well region 236, the transistors PT1 and PT2 of the inverter IN2_B of the unit B are formed. The polysilicon wire Poly_4 is the gate of the transistor PT1. In addition, the source region of the transistor PT1 is connected to the metal wire PWR via a node CT_12 for supply of VDD. A polysilicon wire Poly_6 is the gate of the transistor PT2. In addition, the drain region of the transistor PT2 is connected to the metal wire SLS_B via a node CT_13. The polysilicon wire Poly_6 is connected to the metal wire SLR_B via a node CT_14.

In the NMOS region 214, the transistors NT1 and NT2 of the inverters IN1_A and IN2_A of the latch circuit LAT_A of the unit A and the transistors NT1 and NT2 of the inverters IN1_B and IN2_B of the latch circuit LAT_B of the unit B (not shown) are similarly formed. The eight global bit lines extend along the column direction at an upper layer of the metal wires of the respective elongated rectangular regions 212 of the four rectangular regions 200. The eight global bit lines are connected to the metal wires SNS through the nodes (not shown) by being electrically connected to the sense nodes SNS of the respective page buffers/sense circuits.

Figure 12:
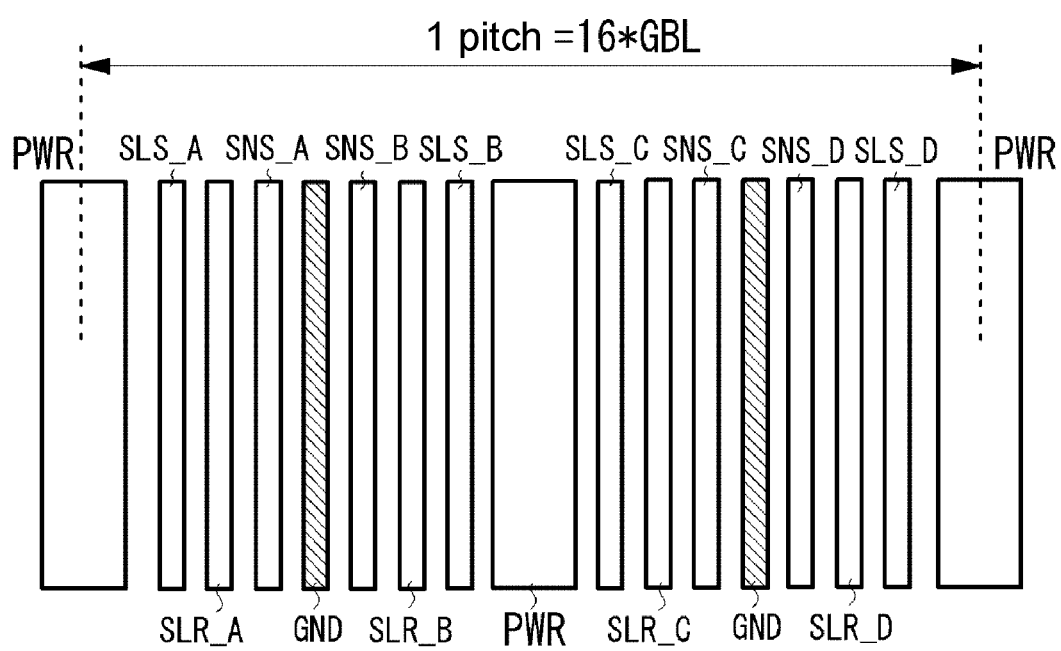
FIG. 12 is a view illustrating a layout of wires when four sets of latch circuits are formed within one pitch according to an embodiment of the invention.

In the embodiment, the page buffers/sense circuits are arranged into 2 columns×four segments when the page buffers/sense circuits are arranged in one pitch along the row direction based on the number of global bit lines extending from the memory cell array or based on the design rule thereof. Nevertheless, the embodiment is only described herein as an example. For example, the width and the pitch of the wires may be further set as ½. Under the circumstance, the page buffers/sense circuits may be arranged into 4 columns×2 segments in one pitch. In such case, as shown in FIG. 12, the metal wires of four sets of latch circuits are arranged in one pitch, and the pattern of another set of the metal wires shown in FIG. 8 is added. The metal wire PWR is formed between the metal wire SLS_B of the second set and a metal wire SLS_C of a third set. Accordingly, the number of page buffers/sense circuits arranged in one pitch in the row direction is set as 8. However, the number is only described herein as an example, and another number greater or less than the number may also be adopted. For example, the number of page buffers/sense circuits arranged in one pitch may be 16. In such case, arrangements with a desirable area efficiency include 2 columns×8 segments, 4 columns×4 segments, 8 columns×2 segments, for example, and arrangements with a less desirable area efficiency include 1 column×16 segments and 16 columns×1 segment, for example.

In the embodiment, the wires for the latch circuits are described as metal wires. However, the invention is not limited thereto. The wires may also be wires formed of a conductive material, such as polysilicon. Besides, in the embodiment, an example where the page buffer/sense circuit includes one latch circuit is described. Nevertheless, when the page buffer/sense circuit carries out pipeline processing on input/output of data, the page buffer/sense circuit may include an additional latch circuit. Even under such circumstance, the additional latch circuit may still be formed within the elongated rectangular region of one pitch.

Moreover, in the embodiment, one even bit line and one odd bit line are described as sharing one sense circuit. However, the invention is not limited thereto. In other words, a configuration where one global bit line uses one sense circuit is also applicable. Namely, the sense node SNS of the page buffer/sense circuit is connected to the global bit line. Under such circumstance, if the one pitch in the row direction is defined based on 16 global bit lines, 16 page buffers/sense circuits are arranged in one pitch. In addition to arrangements with a less desirable area efficiency, such as 1 column×16 segments and 16 columns×1 segment, the 16 page buffers/sense circuits may be arranged into 2 columns×8 segments, 4 columns×4 segments, or 8 columns×2 segments.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor storage device, comprising:
   a memory cell array, comprising a plurality of memory cells;
   a page buffer sense circuit, holding data read from a page selected by the memory cell array or holding data to be programmed to a page selected by the memory cell array,
   wherein within one pitch in a row direction defined by p bit lines extending from the memory cell array, the page buffer sense circuit is arranged into n columns×m segments, wherein n is an integer equal to or greater than 2, and m is an integer equal to or greater than 2,
   wherein one pitch in the row direction is defined based on a designed number or the pitch of wires of an even bit lines and an odd bit lines in the memory cell array.

2. The semiconductor storage device as claimed in claim 1, wherein the page buffer sense circuit comprises a latch circuit, and a plurality of wires for n sets of latch circuits are formed within the one pitch.

3. The semiconductor storage device as claimed in claim 2, wherein a first wire in which a first latch circuit is connected to a first node for holding data is arranged to be different from a second wire in which a second latch circuit is connected to a second node for holding data.

4. The semiconductor storage device as claimed in claim 3, wherein a third wire connected to a first sense node of a first page buffer sense circuit and a fourth wire connected to a second sense node of a second page buffer sense circuit are formed between the first wire and the second wire.

5. The semiconductor storage device as claimed in claim 4, wherein a fifth wire connected to ground is formed between the third wire and the fourth wire.

6. The semiconductor storage device as claimed in claim 5, wherein the first wire and the second wire are arranged to be linearly symmetrical with respect to the fifth wire.

7. The semiconductor storage device as claimed in claim 4, wherein the first node receives a charge from the first sense node through a first transfer transistor, and the second node receives a charge from the second sense node through a second transfer transistor.

8. The semiconductor storage device as claimed in claim 2, wherein the n sets of latch circuits are formed in an N-well region and a P-well region defined based on the one pitch.

9. The semiconductor storage device as claimed in claim 8, wherein P-channel metal-oxide-semiconductor transistors of the n sets of latch circuits are formed in the N-well region, and N-channel metal-oxide-semiconductor transistors of the n sets of latch circuits are formed in the P-well region.

10. The semiconductor storage device as claimed in claim 1, wherein the page buffer sense circuit is arranged into 2 columns×4 segments in the one pitch.

11. The semiconductor storage device as claimed in claim 10, wherein within the one pitch and on inner sides of a pair of wires for power supply, a wire connected to a node of a first latch circuit, a wire connected to another node of the first latch circuit, a wire connected to a first sense node, a wire connected to ground, a wire connected to a node of a second latch circuit, and a wire connected to another node of the second latch circuit are sequentially formed.

* * * * *